United States Patent [19]

Izumita

[11] Patent Number: 5,391,948
[45] Date of Patent: Feb. 21, 1995

[54] SURGE-RESISTANT PROTECTION CIRCUIT FOR VEHICLE

[75] Inventor: Takao Izumita, Singapore, Singapore

[73] Assignee: Kabushiki Kaisha Toshiba, Kawasaki, Japan

[21] Appl. No.: 117,593

[22] Filed: Sep. 8, 1993

[30] Foreign Application Priority Data

Sep. 9, 1992 [JP] Japan ................................. 4-240570

[51] Int. Cl.$^6$ ............................................. H03L 5/00
[52] U.S. Cl. ..................................... 327/310; 327/545; 327/564; 327/565
[58] Field of Search ................... 307/296.4, 540, 303, 307/303.1, 572, 542, 542.1, 639, 551, 565, 259, 503; 361/111, 118, 119, 58

[56] References Cited

U.S. PATENT DOCUMENTS 4,161,759  7/1979  Stein ............................ 361/18
4,855,863  8/1989  Yoshitake ..................... 361/111

OTHER PUBLICATIONS

Smart Powder Application Issues by Motorola Semiconductor Products, Inc. Tokyo, Japan (1988), p. 44.

Primary Examiner—William L. Sikes
Assistant Examiner—James Dudek
Attorney, Agent, or Firm—Finnegan, Henderson, Farabow, Garrett & Dunner

[57] ABSTRACT

An integrated circuit chip has terminals comprising an input terminal, an output terminal to be connected to a load, a power supply terminal to be connected to the positive terminal of a power supply, and a ground terminal to be connected to ground potential (car body). A ground-side common line is associated with the internal circuitry of the integrated circuit chip, and a current-limiting resistor is connected between the ground-side common line and the ground terminal. A diode is connected in parallel with the resistor to limit a surge voltage. The diode is connected with its anode connected to the ground-side common line and its cathode connected to the ground terminal.

10 Claims, 5 Drawing Sheets

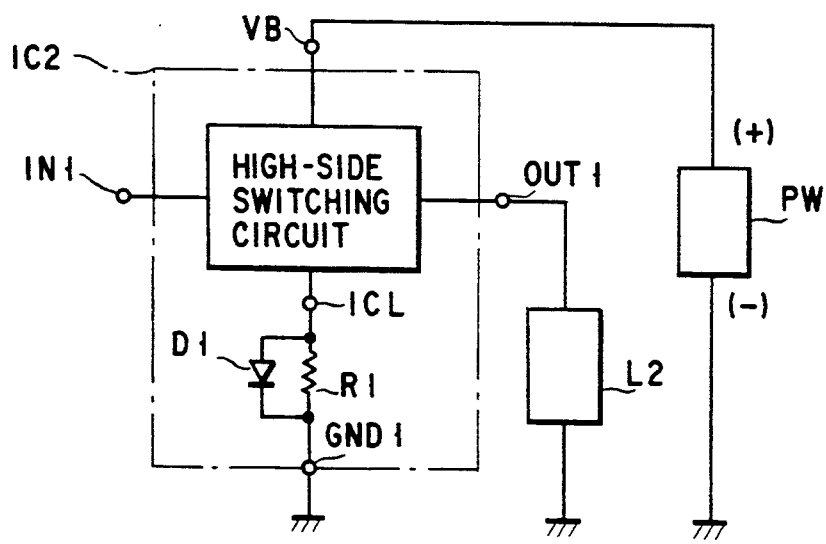
F I G. 3

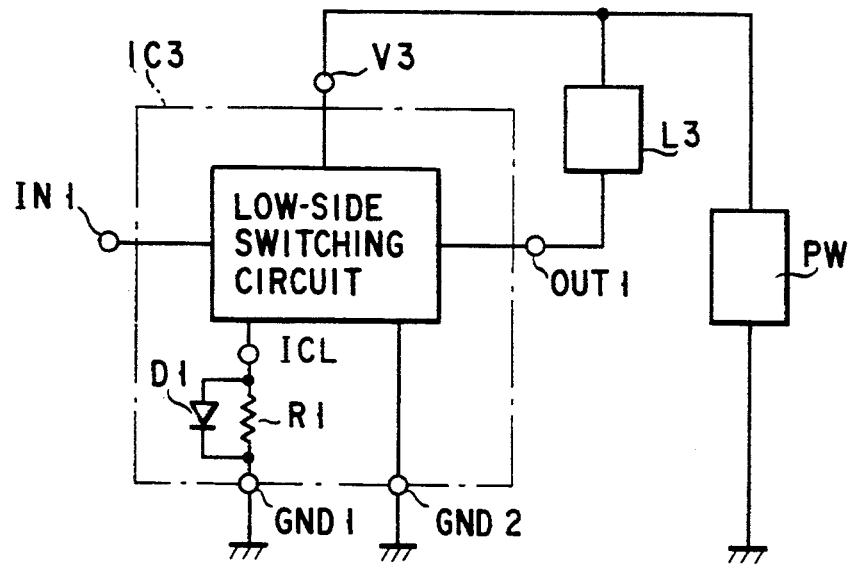
F I G. 4
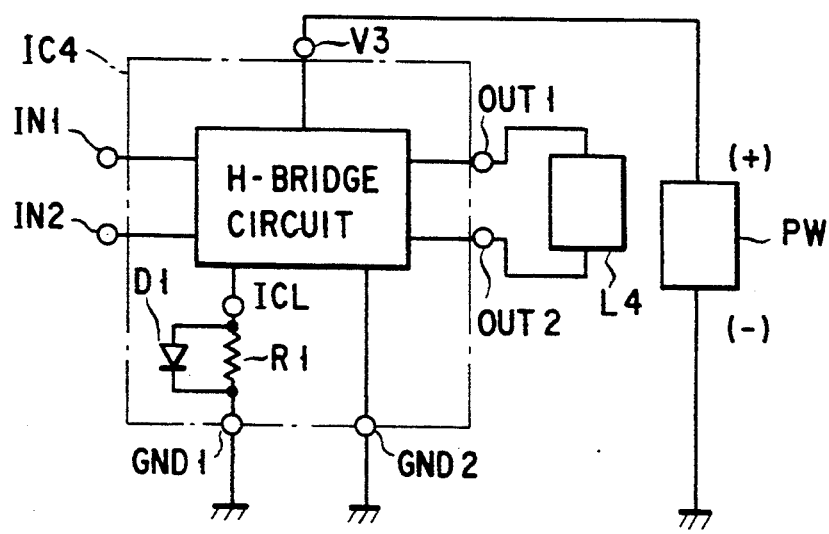
F I G. 5

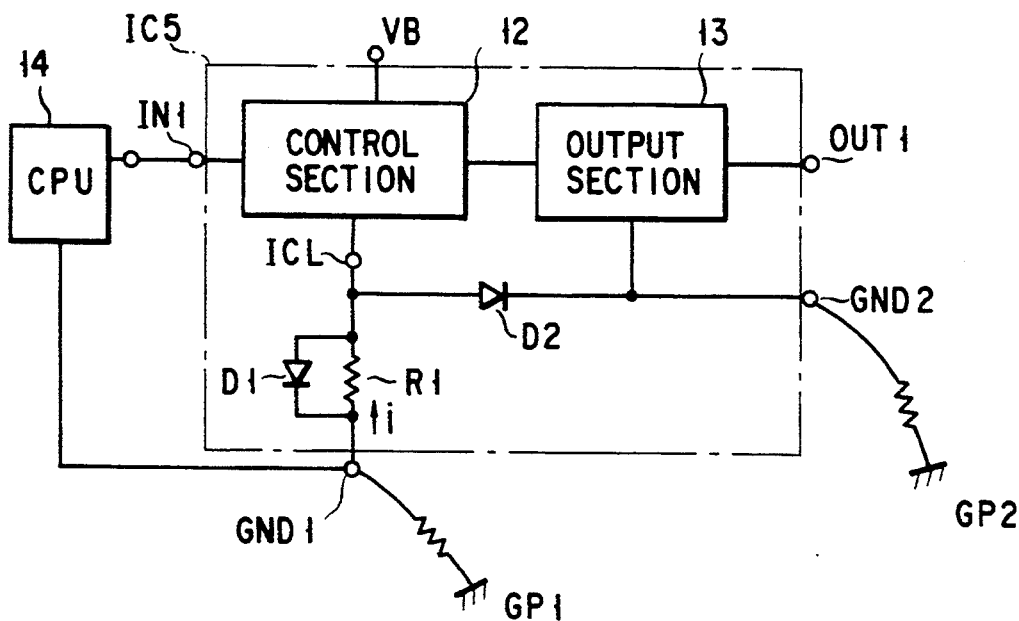
F I G. 8
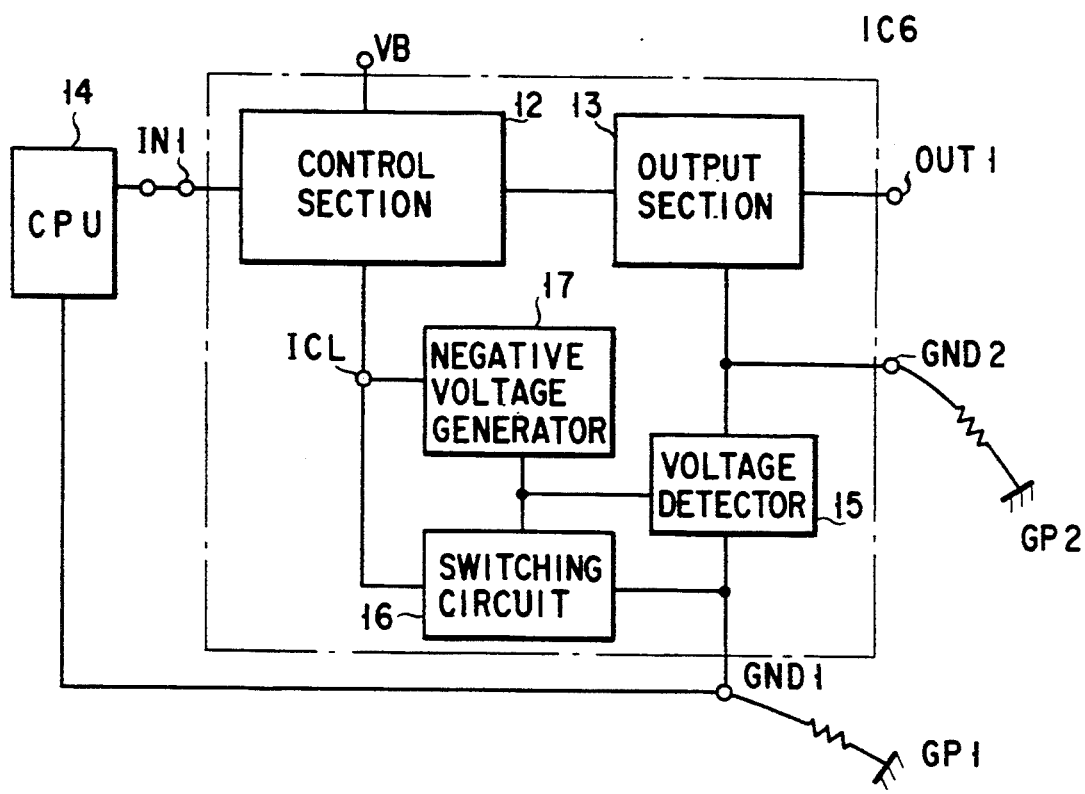
F I G. 9

SURGE-RESISTANT PROTECTION CIRCUIT FOR VEHICLE

BACKGROUND OF THE INVENTION

1. Field of the Invention

The present invention relates to a semiconductor integrated circuit (IC), and more particularly to a circuit arrangement having features which permit the prevention of IC malfunctions due to surge and the IC protection against surge.

2. Description of the Related Art

Various supply voltage levels are used with semiconductor integrated circuits (ICs) which are carried aboard vehicles having limited space into which various devices utilizing electrical and mechanical techniques are incorporated. Batteries aboard vehicles are used as sources for IC supply voltages. In incorporating an IC into a vehicle, a user may make a mistake of reversing connections of the IC to power lines connected to the positive and negative terminals of a battery.

FIG. 1 shows an arrangement of a conventional vehicle-IC protection circuit. An IC chip has an input terminal IN, an output terminal OUT connected to a load L1, a power supply terminal VB connected to a node 11 at the positive side of a power supply PW, and a ground terminal GND1 connected to ground potential (car body). A protection diode D10 has its anode connected to ground potential and its cathode connected to the power supply terminal VB.

Even if, in the above arrangement, the positive node 11 and the ground terminal GND1 were wrong connected, the diode D10 would function to protect the internal circuitry of the IC chip against destruction. That is, a surge voltage applied to the chip from the ground terminal GND1 is limited below the forward voltage drop across the diode D10, thereby protecting the internal circuitry of the IC chip.

FIG. 2 shows another vehicle-IC protection circuit arrangement. In place of the diode D10 of FIG. 1, a protection resistor R10 is provided which is connected between the ground terminal GND1 and a common ground line ICL of the IC. If, in this case, the node 11 were wrong connected to the ground terminal GND1, the protection resistor R10 would limit current to the IC chip, protecting the IC internal circuitry.

The IC protection circuit arrangements of FIGS. 1 and 2 have their respective problems. First, in the case of the arrangement of FIG. 1, in order to meet such a mistake of wrong connection of the power supply, the diode D10 is required to have large current capacity. Thus, the diode will increase in size, involving difficulties in building it into an IC chip. As a result, a built-on device has to be used as the protection diode, which will involve difficulties in placing it in suitable position within vehicle with compactness. In the case of FIG. 2, on the other hand, the protection resistor can be built into an IC chip but has a drawback of low withstand voltage for surge. In ICs aboard vehicles, switching operations are frequent and thus surge voltage is liable to occur all the time due to counter-electromotive force by inductance. Therefore, the surge voltage between the power supply and ground may destroy the protection resistor. For this reason, the arrangement of FIG. 2 provides decreased reliability for vehicle ICs.

SUMMARY OF THE INVENTION

It is accordingly an object of the present invention to provide a semiconductor integrated circuit for vehicles which has a high packing density and a capability of providing IC protection against wrong installation and surge.

According to an aspect of the present invention there is provided an integrated circuit having at least a power supply terminal, a ground terminal, an input terminal, and an output terminal, comprising:

a ground-side common line associated with internal circuitry of the integrated circuit;

a current-limiting resistor connected between the ground-side common line and the ground terminal; and circuit means connected in parallel with the resistor means for limiting a surge voltage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a schematic diagram of a first embodiment of the present invention;

FIG. 4 is a schematic diagram of a second embodiment of the present invention;

FIG. 5 is a schematic diagram of a third embodiment of the present invention;

FIG. 8 is a schematic diagram of a fourth embodiment of the present invention;

FIG. 9 is a schematic diagram of a fifth embodiment of the present invention;

DETAILED DESCRIPTION OF THE PREFERRED EMBODIMENTS

FIG. 3 shows a first embodiment of the present invention which is applied to a high-side switching circuit having a function of turning the power supply line on and off.

An IC chip IC2 comprises an input terminal IN1, an output terminal OUT1 connected to a load L2, a power supply terminal VB connected to the positive terminal of a power supply PW, and a ground terminal GND1 connected to ground potential (car body). The internal circuitry is provided with a ground-side common line ICL which is connected to the ground terminal GND1 by a current-limiting resistor R1. A surge-voltage-limiting diode D1 is connected in parallel with the resistor R1 in such a way that its anode is connected to the common line ICL and its cathode is connected to the ground terminal GND1.

According to the arrangement described above, even if the positive terminal of the power supply is connected to the ground terminal GND1 by mistake, current can be limited by the resistor R1. Furthermore, even if a surge voltage is generated at the ground terminal side under proper connection conditions, the diode D1 will limit the surge voltage impressed across the resistor R1, protecting it against destruction. This will improve the surge withstanding property of the IC chip IC2.

FIG. 4 shows a second embodiment of the present invention, which is applied to a low-side switching circuit which has a function of switching a ground terminal side line on and off. A load L3 connected to the output terminal OUT1 is connected to the power supply side. In contrast with the arrangement of FIG. 3, an IC chip IC3 has two separate ground terminates GND1 and GND2. The ground terminal GND1 is connected to the ground side common line IC1 for handling control current, while the ground terminal GND2 is connected to a line for handling high output current. This suppress variations in potential at the ground terminal GND1.

Between the ground side common line IC1 handling control current and the ground terminal GND1 is connected the current limiting resistor R1 across which the surge voltage limiting diode D1 is connected. The diode D1 is connected, as in the embodiment of FIG. 3, with its anode connected to the ground side common line ICL and its cathode connected to the ground terminal GND1. This arrangement will provide the same advantages as the embodiment described in connection with FIG. 3.

FIG. 5 shows a third embodiment of the present invention which is applied to a H-bridge circuit for driving a motor. In this embodiment, an IC chip IC4 is provided with two separate input terminals IN1 and IN2 and two separate output terminals OUT1 and OUT2. A load L4, such as a motor, is connected between the output terminals. In this arrangement, as in the arrangement of FIG. 4, the IC chip is provided with two separate ground terminals GND1 and GND2. This arrangement will also provide the same advantages as the arrangement of FIG. 3.

Figure 1:
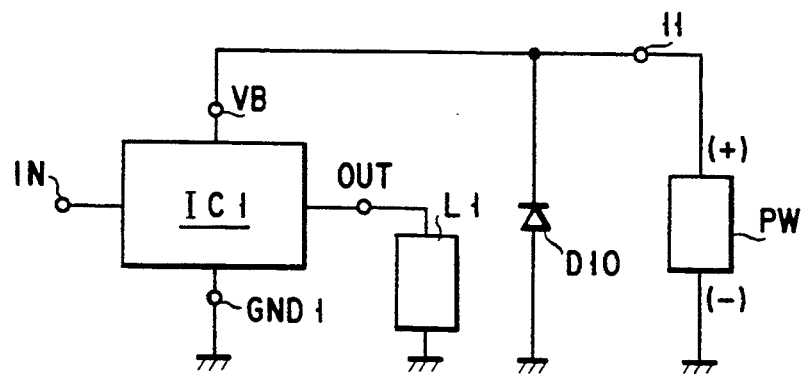
FIG. 1 is a schematic diagram of a first conventional protection circuit for a semiconductor integrated circuit for vehicles.
Figure 2:
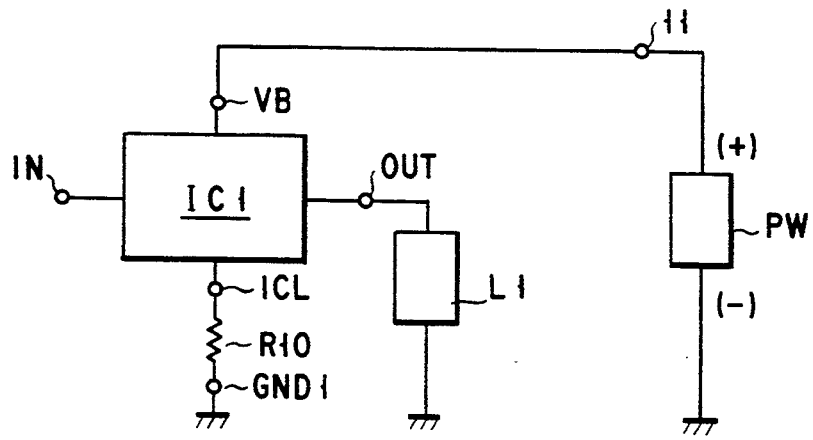
FIG. 2 is a schematic diagram of a second conventional protection circuit for a semiconductor integrated circuit for vehicles.
Figure 6A:
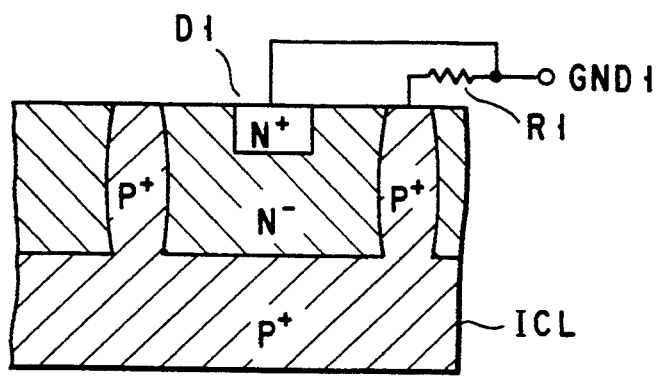
FIGS. 6A and 6B are sectional views of essential portions of the present invention within semiconductor substrates.
Figure 6B:
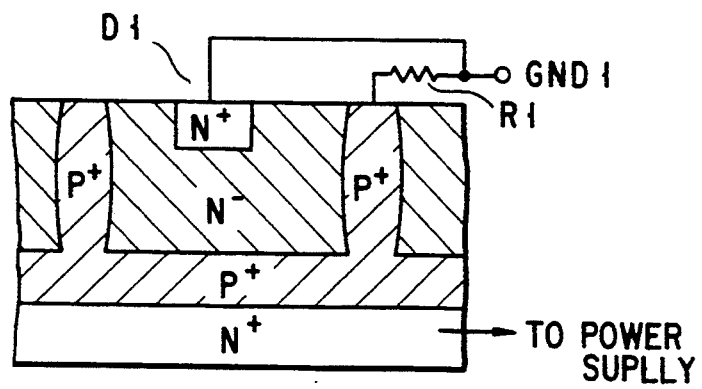

FIGS. 6A and 6B are sectional views of essential portions of the present invention within semiconductor substrates. These figures each show a PN junction isolated structure in which the protection resistor R1 and the diode D1 which are built in the IC chip. In FIG. 6A, a P+ region forms the ground side common line ICL and serves as the anode of the diode D1. The resistor R1 has its one end connected to the P+ region and its other end connected to the ground terminal GND. An N− region is formed isolated by the P+ region. An N+ region, formed within the N− region, serves as the cathode of the diode D1. FIG. 6B shows a structure in which an N+ substrate is used as the power supply side.

Figures 7A, 7B, 7C, 7D:
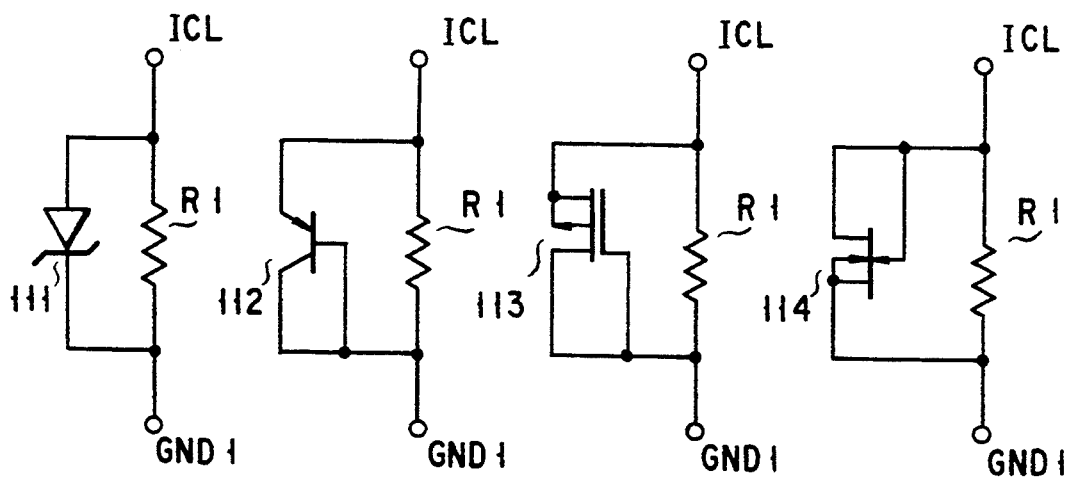
FIGS. 7A to 7D show modifications of essential portions of the present invention.

FIGS. 7A to 7D show modifications of the combination of the protection resistor R1 and the diode D1 which are built in the IC chip. FIG. 7A shows a modification in which a zener diode 111 is used in place of the diode D1. FIG. 7B shows a modification in which a bipolar transistor 112 adapted for diode operation is used. FIG. 7C shows a modification in which a MOSFET 113 is used in place of the diode D1. FIG. 7D shows a modification in which a junction FET 114 is used in place of the diode D1. In each of the modifications, the devices used in place of the diode D1 are each diode-connected. Namely, within a substrate the diode may take various forms according to design.

FIG. 8 shows a fourth embodiment of the present invention. An IC chip IC5 is, for example, a switching power device whose internal circuitry is separated into a control section 12 which handles control current and an output section 13 which handles output current higher than the control current. The IC chip IC5 is supplied at its input terminal with a signal from an external CPU 14, and the control section 12 controls the output section 13. The output section 13 provides an output signal to control equipment not shown, for example, an inductive load or a power device.

Between the ground side common line ICL and the ground terminal GND1 is connected the current limiting resistor R1 across which the surge voltage limiting diode D1 is connected. The diode D1 is connected with its anode connected to the common line ICL and its cathode connected to the ground terminal GND1. The ground terminal GND2 is connected to the common line IC1 through a diode D2 with its anode connected to the common line ICL and its cathode connected to the ground terminal GND2. The ground terminals GND1 and GND2 are connected to separate points of the car body. For example, the ground terminal GND1 is connected to a point GP1 of the car body, while the ground terminal GND2 is connected to a point GP2 of the car body.

With such an arrangement, in case where a surge voltage is generated on the side of the ground terminal GND1, the diode D1 will limit the surge voltage impressed across the resistor R1, protecting it against destruction. This will improve the surge withstanding property of the IC chip IC5.

Since the points GP1 and GP2 of the car body are separate from each other, a potential difference may be produced between them. If, for example, a potential relationship between the ground terminals GND1 and GND2 is such that VGND1>VGND2, the absolute value of the difference between their potentials VGND1 and VGND2 will be represented by $$|VGND1 - VGND2| = R1 \times i + VF$$

where i is current in the resistor R1 flowing from GND1 to IC1 and VF is a forward voltage across the diode D2.

That is, since VGND1>VGND2, the ground terminal GND1 becomes higher in potential than the ground side common line ICL within the IC chip. This reverse-biases the diode D1, producing no current flow therethrough. However, current flow is produced only in the resistor R1, producing a high voltage drop. Therefore, the voltage between the common line ICL and the ground terminal GND2 can surely be limited to a voltage close to the forward voltage VF across the diode D2. That is, the voltage between the control section 12 and output section 13 can be limited to a voltage close to the forward voltage VF across the diode D2.

Thereby, the surge withstanding property of the IC chip is improved and the IC malfunctioning due to variations in potential at the ground terminals GND1 and GND2 is prevented. Moreover, the circuit arrangement needs few components and thus it is easy to be built into an IC chip.

FIG. 9 shows a fifth embodiment of the present invention, which provides for potential variations at the ground terminals GND1 and GND2 due to surge which are larger than in the arrangement of FIG. 8. A voltage detecting circuit 15 is provide between the ground terminals GND1 and GND2. Further, a negative voltage generating circuit 17 is provided between the ground-side common line ICL and the ground terminal GND1, which is responsive to the voltage detecting circuit 15 to provide a negative voltage between the common line ICL and the ground terminal GND1. A switch circuit 16 is further provided which switches the voltage detecting circuit 15 out of the circuit connection.

Figure 10:
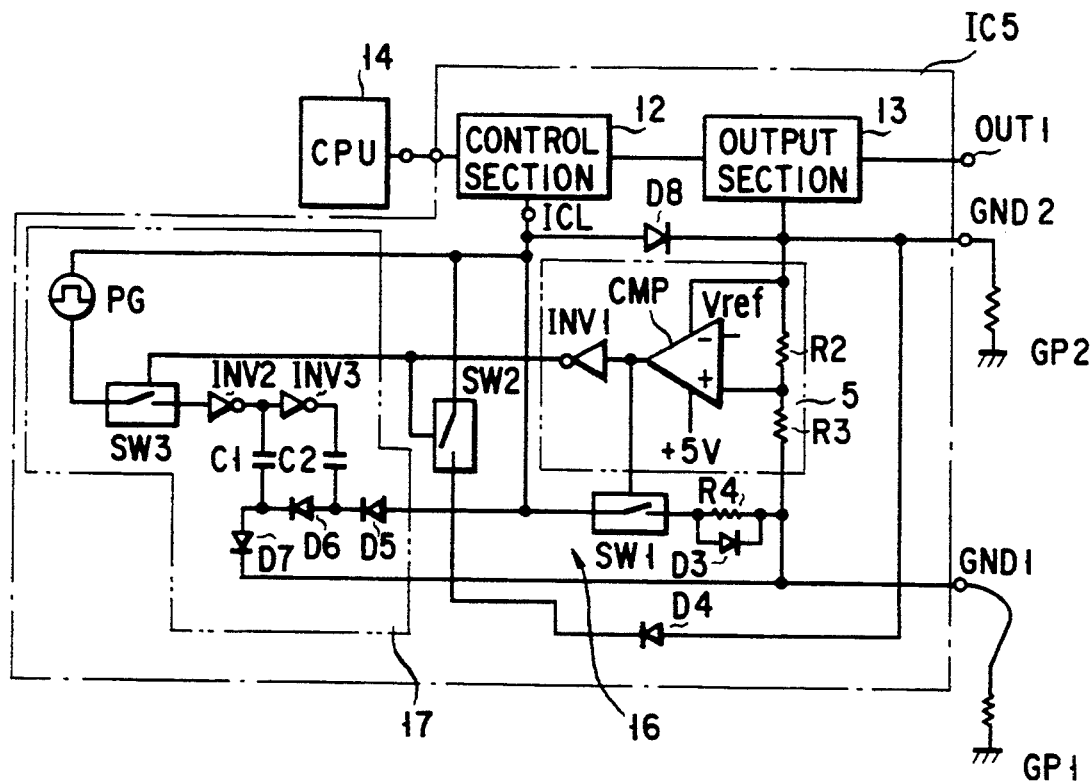
FIG. 10 shows a specific arrangement of the fifth embodiment of FIG. 9.

FIG. 10 shows a specific circuit arrangement of the fifth embodiment of FIG. 9. The voltage detecting circuit 15 is constructed from a comparator CMP which compares a potential difference between the ground terminals GND1 and GND2, detected through resistors R2 and R3, with a reference voltage Vref, and an inverter INV1 which provides a comparator output to the negative voltage generating circuit 17.

The switch circuit 16 comprises a reed relay SW1 which is responsive to a comparator output to electrically disconnect the common line ICL from the ground terminal GND1, a parallel combination, connected in series with the relay SW1, of a resistor R4 for suppressing parasitic operations and a diode D3, and a series combination of a reed relay SW1 and a diode D4 connected between the common line ICL and the ground terminal GND2, the reed relay being controlled by an output of the inverter INV1.

The negative voltage generating circuit 17 comprises a reed relay SW3 responsive to the inverter INV1 connected to the output of the comparator CMP, inverters INV2 and INV3 responsive to a pulse from a pulse generator PG for charging capacitors C1 and C2 with negative voltages, and diodes D5, D6 and D7 for impressing negative voltages across the capacitors C1 and C2 between the common line ICL and the ground terminal GND1.

Note that a diode D8 is provided for suppressing operations of internal parasitic elements when the ground terminals GND1 and GND2 are subject to momentary potential variations.

In the circuit arrangement of FIG. 10, the comparator CMP in the voltage detecting circuit 15 compares a potential difference between the ground terminals GND1 and GND2 with the reference voltage Vref. If the potential difference VGND1−VGND2 (VGND1>VGND2) is higher than the reference voltage Vref, then the comparator CMP will cause the switch circuit 16 and the negative voltage generating circuit 17 to operate in the following manner. In the switch circuit 16, the reed relay SW1 operates to electrically disconnect the common line ICL from the ground terminal GND1, and the relay SW2 operates to electrically connect the diode D4 between the common line ICL and the ground terminal GND2. In the negative voltage generating circuit 17, on the other hand, the reed relay SW3 is operated by the output of the voltage detecting circuit 15, thereby sending a pulse from the pulse generator PG to the capacitors C1 and C2 through the inverters INV2 and INV3 to charge them with negative voltages. The charged voltages across the capacitors C1 and C2 will maintain the common line ICL at a negative potential with respect to the ground terminal GND1 through the diodes D5, D6 and D7. In this case, the potential difference between the common line ICL and the ground terminal GND2 is determined by the diode D4.

Thus, the negative voltage generating circuit 17 applies a negative voltage to the common line ICL so that the potentials at the common line ICL and the ground terminal GND2 will be VICL<VGND2. This will suppress the operations of internal parasitic elements and prevent IC malfunctioning due to surge. In addition, the circuit arrangement is so simple that it can be built into an IC chip with ease.

Figure 11:
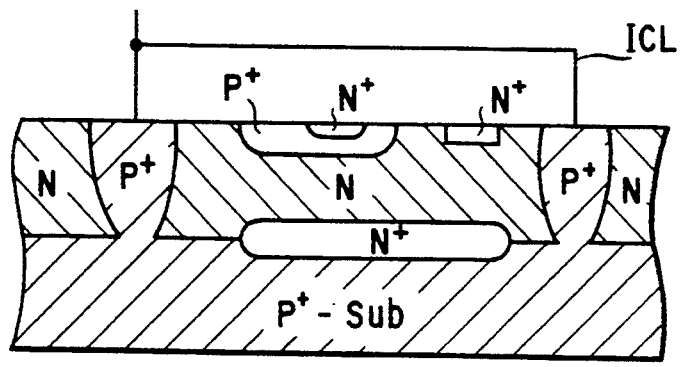
FIG. 11 is a sectional view of a semiconductor substrate showing a relationship between a ground-side common line and circuit elements.

FIG. 11 is a sectional view illustrating a relationship between the common Line IC1 and circuit elements within a semiconductor substrate. This figure shows a PN junction isolated structure, and the ground-side common line ICL is wired above circuit elements through PN junction isolating layers extending from a P+ substrate.

According to the present invention, as described above, there are provided surge-resistant, malfunction-preventing circuit arrangements which are specially adapted for ICs aboard vehicles that are subject to surge and need several power-supply earth points.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An integrated circuit having at least a power supply terminal, an input terminal, an output terminal, and a plurality of points for external connection, comprising:

internal circuitry of said integrated circuit having a control section for handling control current and an output section for handling an output current higher than said control current;

a ground-side common line associated with said internal circuitry of said integrated circuit;

a first ground terminal to which a grounding path for said control current of said control section is connected through said ground-side common line;

a second ground terminal to which a grounding path for said output current of said output section is connected through said ground-side common line;

a diode for connecting said grounding path for said control current of said control section and said grounding path for said output current of said output section in said ground-side common line;

a current-limiting resistor connected between said first ground terminal and said ground-side common line; and circuit means connected in parallel with said resistor for limiting a surge voltage.

2. An integrated circuit according to claim 1, in which said circuit means comprises a diode means with its anode connected to said ground-side common line and its cathode connected to said ground terminal.

3. An integrated circuit according to claim 2, in which said diode means comprises a zener diode.

4. An integrated circuit according to claim 2, in which said diode means comprises a bipolar transistor.

5. An integrated circuit according to claim 2, in which said diode means comprises a MOSFET.

6. An integrated circuit according to claim 2, in which said diode means comprises a junction FET.

7. An integrated circuit according to claim 2, further comprising:
  voltage detecting means installed inside said integrated circuit for detecting a potential difference between said first and second ground terminals;
  negative voltage generating means responsive to said voltage detecting means for impressing a negative voltage between said first ground terminal and said ground-side common line; and
  switching means connected between said first ground terminal and said ground-side common line and between said second ground terminal and said ground-side common line.

8. An integrated circuit according to claim 2, further comprising:
  voltage detecting means installed inside said integrated circuit for detecting a potential difference between said first and second ground terminals;
  negative voltage generating means responsive to said voltage detecting means for impressing a negative voltage between said first ground terminal and said ground-side common line; and
  switching means connected between said first ground terminal and said ground-side common line and between said second ground terminal and said ground-side common line.

9. An integrated circuit having at least a power supply terminal, a ground terminal, an input terminal, an output terminal, and a plurality of points to be connected to the outside, comprising:
  internal circuitry of said integrated circuit having a control section for handling control current and an output section for handling an output current higher than said control current;
  a ground-side common line associated with said internal circuitry of said integrated circuit;
  a first ground terminal to which a grounding path for said output current of said output section is connected through said ground-side common line;
  a second ground terminal to which a grounding path for said control current of said control section is connected through said ground-said common line;
  first diode means for connecting said grounding path for said control current of said control section and said grounding path for said output current of said output section in said ground-side common line, said first diode means including an anode connected to said ground-side common line and a cathode connected to said first ground terminal;
  a current-limiting resistor connected between said second ground terminal and said ground-side common line; and
  second diode means connected in parallel with said resistor for limiting a surge voltage, said second diode means including an anode connected to said ground-side common line and a cathode connected to said second ground terminal.

10. An integrated circuit having at least a power supply terminal, a ground terminal, an input terminal, an output terminal, and a plurality of points to be connected to the outside, comprising:
  internal circuitry of said integrated circuit having a control section for handling control current and an output section for handling an output current higher than said control current;
  a ground-side common line associated with said internal circuitry of said integrated circuit;
  a first ground terminal to which a grounding path for said control current of said control section is connected through said ground-side common line;
  a second ground terminal to which a grounding path for said output current of said output section is connected through said ground-side common line;
  a diode for connecting said grounding path for said control current of said control section and said grounding path for said output current of said output section in said ground-side common line;
  a current-limiting resistor connected between said first ground terminal and said ground-side common line;
  circuit means connected in parallel with said resistor for limiting a surge voltage;
  voltage detecting means installed inside said integrated circuit for detecting a potential difference between said first and second ground terminals;
  negative voltage generating means responsive to said voltage detecting means for impressing a negative voltage between said first ground terminal and said ground-side common line; and
  switching means connected between said first ground terminal and said ground-side common line and between said second ground terminal and said ground-side common line.

\* \* \* \* \*